United States Patent
Bedell et al.

(10) Patent No.: US 9,472,411 B1
(45) Date of Patent: Oct. 18, 2016

(54) SPALLING USING DISSOLVABLE RELEASE LAYER

(71) Applicant: International Business Machines Corporation, Armonk, NY (US)

(72) Inventors: Stephen W. Bedell, Wappingers Falls, NY (US); Cheng-Wei Cheng, White Plains, NY (US); Ning Li, White Plains, NY (US); Devendra K. Sadana, Pleasantville, NY (US); Katherine L. Saenger, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/670,970

(22) Filed: Mar. 27, 2015

(51) Int. Cl.
| | | |
|---|---|---|
| *H01L 21/02* | (2006.01) | |
| *H01L 21/304* | (2006.01) | |
| *H01L 21/321* | (2006.01) | |
| *H01L 31/18* | (2006.01) | |

(52) U.S. Cl.
CPC ..... *H01L 21/3046* (2013.01); *H01L 21/02491* (2013.01); *H01L 21/321* (2013.01); *H01L 31/1892* (2013.01)

(58) Field of Classification Search
CPC .................. H01L 21/02365; H01L 21/02436; H01L 21/02518; H01L 21/70; H01L 21/702
See application file for complete search history.

(56) References Cited

U.S. PATENT DOCUMENTS

| | | | |
|---|---|---|---|
| 7,166,326 B1 * | 1/2007 | DiStefano | C25D 1/00 257/E21.705 |
| 7,259,106 B2 | 8/2007 | Jain | |
| 8,043,931 B1 | 10/2011 | Zhang | |
| 8,242,348 B2 | 8/2012 | Woolf | |
| 8,357,616 B2 | 1/2013 | Linder et al. | |
| 8,394,660 B2 | 3/2013 | Kim et al. | |
| 8,507,363 B2 | 8/2013 | Lei et al. | |
| 8,637,346 B1 | 1/2014 | Jung et al. | |
| 2007/0158816 A1 * | 7/2007 | Chow | G01R 1/06761 257/690 |
| 2012/0309269 A1 * | 12/2012 | Khayyat | H01L 21/187 451/41 |
| 2014/0001452 A1 | 1/2014 | Shiobara et al. | |
| 2014/0256206 A1 * | 9/2014 | Kim | H01L 51/003 445/24 |

OTHER PUBLICATIONS

Linder et al., "Water-Soluble Sacrificial Layers for Surface Micromachining," Wiley-VCH Verlag GmbH & Co. KGaA, D-69451, Weinheim, Small, Jul. 2005, vol. 1, No. 7, DOI: 10.1002/smll.200400159, 730-736.

* cited by examiner

*Primary Examiner* — Cheung Lee
(74) *Attorney, Agent, or Firm* — Louis J. Percello; Erik K. Johnson

(57) ABSTRACT

A method of performing spalling of a semiconductor substrate in which a release layer is used between a handling substrate and a stressor layer. The release layer is removed using a liquid that does not damage the spalled semiconductor substrate.

20 Claims, 2 Drawing Sheets

SPALLING USING DISSOLVABLE RELEASE LAYER

BACKGROUND

The present invention relates to semiconductor device manufacturing, and more particularly, to methods for removing a high-quality material layer from a base substrate by spalling.

Devices that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if the substrate from which a device layer is removed can be reused, additional fabrication cost reduction can be achieved.

Recent advances in spalling techniques now make it possible to remove, i.e., spall, a thin (typically less than 100 µm) material layer from an entire surface of base substrate with near-zero thickness direction kerf losses, and to do this multiple times on the same base substrate. The potential cost savings are enormous since (i) the thickness of the spalled material layer can be limited to the thickness needed for thin-film devices, and (ii) many spalled material layers may be derived from a single base substrate.

BRIEF SUMMARY

An embodiment of the invention may include a method of forming a semiconductor structure. The method may include forming a stressor layer on a crystalline substrate, whereby the stressor layer is under tensile stress. A release layer may be formed on the stressor layer. A handling substrate may be formed on the release layer. Spalling of the substrate may then be performed. Spalling of the substrate propagates a fracture in the crystalline substrate. The release layer may then be removed using a release solvent, which in turn removes the handling substrate.

BRIEF DESCRIPTION OF THE SEVERAL DRAWINGS

Figure 1:
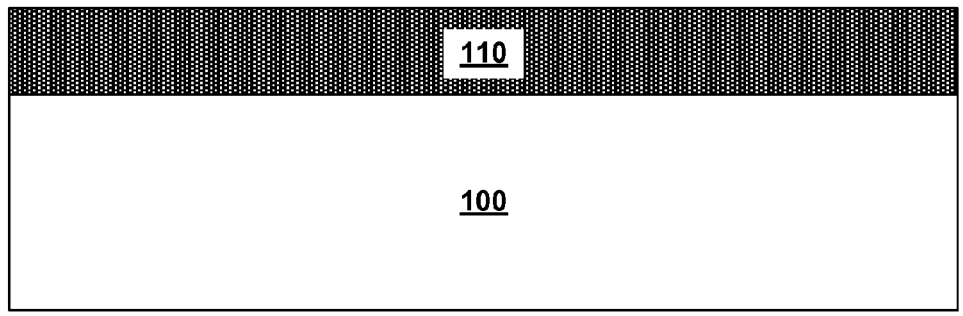
FIG. 1 is a cross-sectional view of a substrate with a stressor layer above it, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Spalling is a useful technique in creating thin film devices by fracturing a surface of a crystalline substrate through use of stress created by differences in material properties of the material to be fractured and a stressor material. However, in introducing such forces, handling substrates may need to be attached to the stressor material to encourage the fracturing of the substrate, and may be difficult to remove. By forming a release layer capable of being dissolved, removal of handling substrates may be accomplished using liquids, such as solvents, that do not damage the spalled substrate.

Referring first to FIG. 1, there is illustrated a crystalline semiconductor substrate 100. The semiconductor material of the crystalline semiconductor substrate 100 may include, but is not limited to, Si, Ge, SiGe, SiGeC, SiC, Ge alloys, GaSb, GaP, GaN, GaAs, InAs, InP, and all other III-V or II-VI compound semiconductors. Typically, the crystalline semiconductor substrate 100 is comprised of silicon. In some embodiments, the crystalline semiconductor substrate 100 is a bulk semiconductor material. In other embodiments, the crystalline semiconductor substrate 100 may comprise a layered semiconductor material such as, for example, a semiconductor-on-insulator or a semiconductor on a polymeric substrate. Illustrated examples of semiconductor-oninsulator substrates that may be employed as crystalline semiconductor substrate 100 include silicon-on-insulators and silicon-germanium-on-insulators. The crystalline semiconductor substrate 100 may be doped, undoped or contain doped regions and undoped regions.

The term "crystalline" as used in connection with the term crystalline semiconductor substrate 100 denotes a semiconductor material in which a single crystal lattice of the entire sample is continuous and unbroken to the edges of the sample, with no grain boundaries, or in which a polycrystalline lattice of the entire sample contains multiple crystal types. In a preferred embodiment, the crystalline semiconductor substrate 100 is a single crystal lattice structure. The crystalline semiconductor substrate 100 that may be employed in the present disclosure comprise a semiconductor material whose fracture toughness is less than that of the stressor material to be subsequently described. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

Still Referring to FIG. 1, a stressor layer 110 may be formed on an exposed surface of the crystalline semiconductor substrate 100. The stressor layer 110 that is employed in the present disclosure includes any material that is under tensile stress when located atop the crystalline semiconductor substrate 100 at the spalling temperature. As such, the stressor material may also be referred to herein as a stress-inducing material, as it introduces stress into the crystalline semiconductor substrate 100. In accordance with the present disclosure, the stressor layer 110 has a critical thickness and stress value that cause spalling mode fracture to occur within the crystalline semiconductor substrate 100. By "spalling mode fracture" it is meant that a crack is formed within the crystalline semiconductor substrate 100 and the combination of loading forces maintain a crack trajectory at a depth below the stressor/substrate interface. By "critical condition", it is meant that for a given stressor material and crystalline semiconductor substrate material combination, a thickness value and a stressor value for the stressor layer 110 is chosen that render spalling mode fracture possible (may produce a $K_I$ value greater than the $K_{IC}$ of the substrate).

The thickness of the stressor layer 110 is chosen to provide a desired fracture depth(s) within the crystalline semiconductor substrate 100. For example, if the stressor layer 110 is chosen to be Ni, then fracture will occur at a depth below the stressor layer 110 roughly 2 to 3 times the Ni thickness. The stress value for the stressor layer 110 is chosen to satisfy the critical condition for spalling mode fracture. This may be estimated by inverting the empirical equation given by $t^*=[(2.5\times10^6)(K_{IC}^{3/2})]/\sigma^2$, where $t^*$ is the critical stressor layer thickness (in microns), $K_{IC}$ is the fracture toughness (in units of MPa·m$^{1/2}$) of the crystalline semiconductor substrate 100 and $\sigma$ is the stress value of the stressor layer 110 (in MPa or megapascals). The above expression is a guide, in practice, spalling may occur at stress or thickness values up to 20% less than that predicted by the above expression.

Illustrative examples of materials that are under tensile stress when applied above the crystalline semiconductor substrate 100 and thus may be used as the stressor layer 110 include, but are not limited to, a metal, a polymer, such as a spall inducing tape layer, or any combination thereof. The stressor layer 110 may comprise a single stressor material, or a multilayered stressor structure including at least two layers of different stressor material may be employed. In one embodiment, the stressor layer 110 is a metal. In another embodiment, the stressor layer 110 is a spall inducing tape. In yet another embodiment, the stressor layer 110 may include multiple metal, polymer or tape layers to induce a stress.

When a metal is employed as stressor layer 110, the metal may include, for example, Ni, Cr, Fe, or W. Alloys of these metals may also be employed. In one embodiment, the stressor layer 110 includes at least one layer consisting of Ni.

When a polymer is employed as stressor layer 110, the polymer is a large macromolecule composed of repeating structural units. These subunits are typically connected by covalent chemical bonds. Illustrative examples of polymers that may be employed as the stressor layer include, but are not limited to, polyimides, polyesters, polyolefins, polyacrylates, polyurethane, polyvinyl acetate, and polyvinyl chloride.

When a spall inducing tape layer is employed as stressor layer 110, the spall inducing tape layer includes any pressure sensitive tape that is flexible, soft, and stress free at a first temperature used to form the tape, yet strong, ductile and tensile at a second temperature used during spalling. By "pressure sensitive tape," it is meant an adhesive tape that will stick with application of pressure, without the need for solvent, heat, or water for activation. Tensile stress in the tape at the second temperature is primarily due to thermal expansion mismatch between the crystalline semiconductor substrate 100 (with a lower thermal coefficient of expansion) and the tape (with a higher thermal expansion coefficient).

Typically, the pressure sensitive tape that is employed in the present disclosure as stressor layer 110 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that may increase the plasticity of the polymeric material to which they are added.

The stressor layer 110 may be formed utilizing any well known deposition process. Generally, deposition may be accomplished by any of dip coating, spin-coating, brush coating, sputtering, chemical vapor deposition, plasma enhanced chemical vapor deposition, chemical solution deposition, physical vapor deposition, and plating to form the stressor layer 110 that includes a metal or polymer as the stressor material. In some embodiments, and when the stressor layer 110 is a tape, the stressor layer 110 may be applied by hand or by mechanical means.

The stressor layer 110 may be formed at a first temperature which is at room temperature (15° C. to 40° C.). In another embodiment, when a tape layer is employed, the tape layer may be formed at a first temperature which is from 15° C. to 60° C.

If the stressor layer 110 is of a metallic nature, it typically has a thickness within a range from 3 µm to 50 µm, with a thickness within a range from 4 µm to 7 µm being more typical. Other thicknesses for the stressor layer 110 that are below and/or above the aforementioned thickness ranges may also be employed in the present disclosure.

If the stressor layer 110 is of a polymeric nature, it typically has a thickness in a range from 10 µm to 200 µm, with a thickness within a range from 50 µm to 100 µm being more typical. Other thicknesses for the stressor layer 110 that are below and/or above the aforementioned thickness ranges may also be employed in the present disclosure.

In some optional embodiments a surface protection layer (not shown) may be formed on the substrate prior to forming the stressor layer 110. The surface protection layer that is employed in the present disclosure includes any material which may serve as an etch stop for the subsequently formed stressor layer 110. In one embodiment of the present disclosure, the surface protection layer may include, but is not limited to, Ti/W, Ti, Cr, Ni or any combination thereof. Typically, and when Ni is used as the material of the stressor layer 110, the surface protection layer comprises Ti. The surface protection layer may comprise a single layer or it may include a multilayered structure comprising at least two layers of different.

The surface protection layer may be formed at room temperature (15° C. to 40° C., i.e., 288K to 313K) or above. In one embodiment, the surface protection layer may be formed at a temperature which is from 20° C. (293K) to 180° C. (353K). In another embodiment, the surface protection layer may be formed at a temperature which is from 20° C. (293K) to 60° C. (333K).

The surface protection layer may be formed utilizing deposition techniques that are well known to those skilled in the art. For example, the surface protection layer may be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

In one embodiment, the surface protection layer typically has a thickness from 5 nm to 200 nm, with a thickness from 100 nm to 150 nm being more typical. Other thicknesses for the surface protection layer that are below and/or above the aforementioned thickness ranges may also be employed in the present disclosure.

In some embodiments, and prior to forming the stressor layer 110, an optional plating seed layer (not shown) may be formed on the surface protection layer. The optional plating seed layer is typically employed in embodiments in which the stressor material to be subsequently formed is a metal and plating is used to form the metal-containing stressor material. The optional plating seed layer is employed to selectively promote subsequent plating of a pre-selected metal-containing stressor material. The optional plating seed layer may comprise, for example, a single layer of Ni or a layered structure of two or more metals such as Al(bottom)/Ti/Ni(top).

The thickness of the optional plating seed layer may vary depending on the material or materials of the optional plating seed layer as well as the technique used in forming the same. Typically, the optional plating seed layer has a thickness from 2 nm to 400 nm. The optional plating seed layer may be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

In accordance with the present disclosure, the surface protection layer and, if employed, the optional plating seed layer, is (are) formed at a temperature which does not effectuate spontaneous spalling to occur within the crystalline semiconductor substrate 100. By "spontaneous" it is meant that the removal of a thin material layer from the crystalline semiconductor substrate 100 occurs without the need to employ any manual means to initiate crack formation and propagation for breaking apart the thin material layer from the crystalline semiconductor substrate 100. By "manual" it is meant that crack formation and propagation are explicit for breaking apart the thin material layer from the crystalline semiconductor substrate 100.

Figure 2:
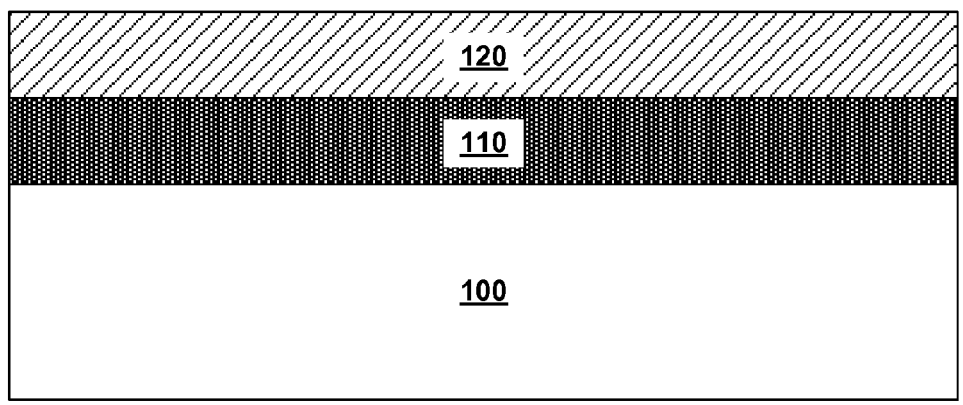
FIG. 2 is a cross-sectional view of a substrate following deposition of a dissolvable organic layer, according to an exemplary embodiment.

Referring to FIG. 2, a release layer 120 may be formed on the stressor layer 110. The release layer may be any material capable of providing adequate adhesion to allow a first handle substrate 130 (FIG. 3) to initiate spalling of the crystalline semiconductor substrate 100. Additionally, the release layer 120 should be selected such that it will be capable of removal from the stressor layer 110 without the use of solvents, reactants, or caustics that may damage the crystalline semiconductor substrate 100. More specifically, the release layer 120 should not exhibit a fracture within the release layer 120, or the release layer should not separate from the stressor layer 110 or the first handle substrate 130, under such tensile stress.

In an embodiment, the release layer 120 may be a polymeric material. Polymeric materials may include straight chain, branched or crosslinked, and may be homopolymers or heteropolymers, or any other configuration. Polymeric materials may include, for example, amides, imides, acrylates, epoxies, urethanes, silanes, silicones, or other polymers known in the art. In an exemplary embodiment, polymethylmethacrylate (PMMA) may be used as the release layer 120. Such polymeric materials may also contain catalysts, or other chemicals that may encourage a polymerization reaction. The release layer may have a thickness within a range from a 10 nanometers to a 100 µm. In a preferred embodiment, a PMMA release layer may be formed by spin coating.

Figure 3:
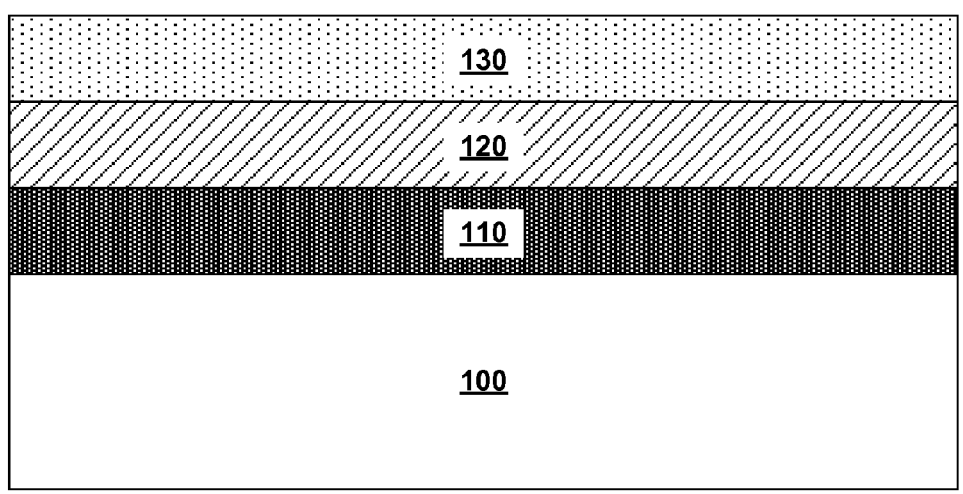
FIG. 3 is a cross-sectional view of substrate following application of a handler to the dissolvable organic layer, according to an exemplary embodiment.

Referring to FIG. 3, a first handle substrate 130 may be formed above the release layer 120 prior to spalling. The first handle substrate 130 employed in the present disclosure comprises any flexible material which has a minimum radius of curvature that is typically less than 30 cm. Illustrative examples of flexible materials that may be employed as the first handle substrate 130 include a metal foil or a polyimide foil.

The first handle substrate 130 may be used to provide better fracture control and more versatility in handling the spalled portion, i.e., the portion of the crystalline semiconductor substrate 100 below the stressor layer 110 and above the fracture surfaces of the crystalline semiconductor substrate 100. Moreover, the first handle substrate 130 may be used to guide the crack propagation during spalling. The first handle substrate 130 of the present disclosure is typically, but not necessarily, formed at a first temperature which is at room temperature (15° C. to 40° C.).

The first handle substrate 130 may be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. In some embodiments, the first handle substrate 130 may be applied atop the release layer 120 by hand or by mechanical means.

The first handle substrate 130 typical has a thickness of from 1 µm to few mm, with a thickness of from 70 µm to 120 µm being more typical. Other thicknesses for the first handle substrate 130 that are below and/or above the aforementioned thickness ranges may also be employed in the present disclosure.

Figure 4:
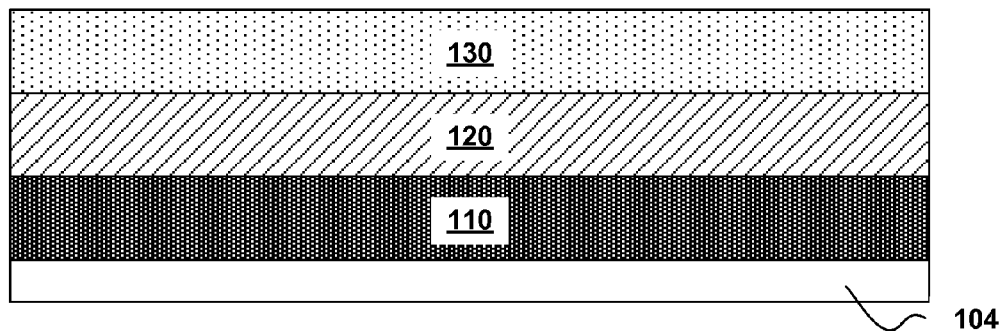
FIG. 4 is a cross-sectional view following spalling of the substrate, according to an exemplary embodiment.

As shown in FIG. 4, spalling removes a portion of the crystalline semiconductor substrate 100 from another portion of the crystalline semiconductor substrate 100. Element 104 may be referred to herein as a spalled crystalline semiconductor layer (or spalled layer for short), while element 102 may be referred to herein as a non-spalled layer. As shown, the spalled layer 104 is still attached to the stressor layer 110, the release layer 120 and the first handle substrate 130.

In one embodiment of the present disclosure, the spalled layer 104 has a thickness of less than 100 microns. In another embodiment of the present disclosure, the spalled layer 104 has a thickness of less than 50 microns. In yet another embodiment of the present disclosure, spalled layer 104 has a thickness from 25 microns to 40 microns.

Spalling may be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process may be achieved by cooling the structure down below room temperature utilizing any cooling means. For example, cooling may be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly warm up to room temperature by allowing the same to stand at room temperature. Alternatively, the spalled structure may be heated up to room temperature utilizing any heating means.

Figure 5:
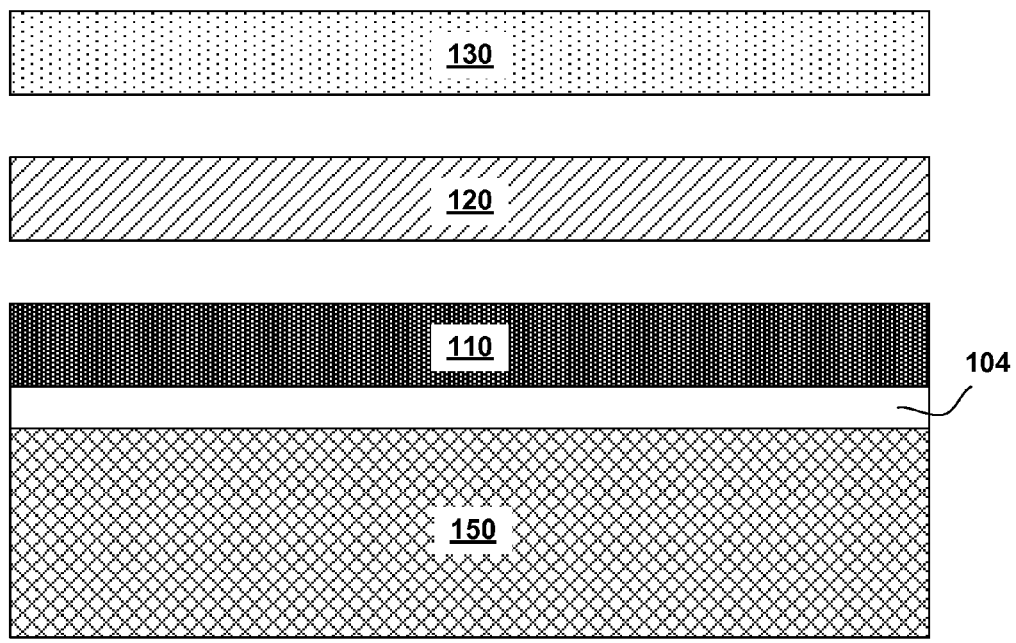
FIG. 5 is a cross-sectional view following removal a dissolvable organic layer, according to an exemplary embodiment.

Referring to FIG. 5, the spalled layer 104 may be removed from the release layer 120. The release layer 120 may be removed using any liquid capable of dissolving the release layer 120, without damaging the spalled substrate 104. In embodiments where a polymeric material is used as the release layer 120, organic solvents may be employed to dissolve the release layer 120. Such organic solvents may include, but not limited to, alkanes, alkenes, alcohols, esters, ethers, ketones, amides, imides, ketones, cyclic hydrocarbons, aromatics, or combinations thereof. In a preferred embodiment, acetone may be used as a solvent to remove a PMMA release layer.

In some embodiments the spalled substrate 104 may be attached to a second handling layer 150. The second handle substrate 150 may be made of the same materials, and using the same processes, as those listed above for the first handle substrate 130. Following the removal of the release layer 120, the stressor layer 110 may be removed using mechanical or chemical means, such as CMP or etching. Following such techniques, the spalled substrate 104 may be used to create semiconductor structures on the thin film, using the second handling layer 150 as structural support during processing of the material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    forming a stressor layer on a crystalline substrate, wherein the stressor layer is under tensile stress;
    forming a release layer on the stressor layer;
    forming a handling substrate on the release layer;
    performing spalling of the substrate, wherein spalling propagates a fracture in the crystalline substrate using a force necessary to propagate the fracture, and wherein the release layer withstands the force necessary to propagate the fracture;
    removing the release layer and the handling substrate using a release solvent.

2. The method of claim 1, wherein the release layer comprises a polymer.

3. The method of claim 2, wherein the release layer comprises polymethylmethacrylate.

4. The method of claim 1, wherein the crystalline substrate is a single crystalline substrate.

5. The method of claim 1, wherein the stressor layer comprises a metal.

6. The method of claim 5 wherein the metal of the stressor layer comprises nickel, chromium, iron or tungsten.

7. The method of claim 1, wherein the stressor layer comprises a polymer.

8. The method of claim 1, wherein the fracture occurs less than 100 microns below the surface of the crystalline substrate.

9. The method of claim 1, further comprising removing the stressor layer by etching the stressor layer.

10. The method of claim 1, wherein the release layer does not separate from the stressor layer while performing spalling of the substrate.

11. The method of claim 1, wherein the release layer does not fracture while performing the spalling of the substrate.

12. A method of forming a semiconductor structure, the method comprising:
    forming a stressor layer on a crystalline substrate, wherein the stressor layer is under tensile stress;
    forming a release layer on the stressor layer;
    forming a handling substrate on the release layer;
    performing spalling of the substrate, wherein spalling propagates a fracture in the crystalline substrate using a force necessary to propagate the fracture, and wherein the release layer withstands the force necessary to propagate the fracture;
    removing the release layer and the handling substrate using a release solvent, wherein the release solvent dissolves the release layer, and wherein the release solvent does not react with the crystalline substrate.

13. The method of claim 12, wherein the release layer comprises a polymer.

14. The method of claim 13, wherein the release layer comprises polymethylmethacrylate.

15. The method of claim 12, wherein the release solvent is acetone.

16. The method of claim 12, wherein the crystalline substrate is a single crystalline substrate.

17. The method of claim 12, wherein the stressor layer comprises a metal.

18. The method of claim 17, wherein the metal of the stressor layer comprises nickel, chromium, iron or tungsten.

19. The method of claim 12, wherein the release layer does not separate from the stressor layer while performing spalling of the substrate.

20. The method of claim 12, wherein the release layer does not fracture while performing the spalling of the substrate.

* * * * *